United States Patent
Alexander

(10) Patent No.: US 9,894,788 B2
(45) Date of Patent: Feb. 13, 2018

(54) FIELD REPLACEABLE POWER SUPPLY CARTRIDGE

(71) Applicant: EcoSense Lighting Inc., Los Angeles, CA (US)

(72) Inventor: Clayton Alexander, Westlake Village, CA (US)

(73) Assignee: ECOSENSE LIGHTING INC., Los Angeles, CA (US)

( * ) Notice: Subject to any disclaimer, the term of this patent is extended or adjusted under 35 U.S.C. 154(b) by 0 days.

(21) Appl. No.: 15/390,475

(22) Filed: Dec. 24, 2016

(65) Prior Publication Data

US 2017/0112010 A1    Apr. 20, 2017

Related U.S. Application Data

(63) Continuation of application No. 14/178,157, filed on Feb. 11, 2014, now Pat. No. 9,565,782.

(Continued)

(51) Int. Cl.
| | |
|---|---|
| H05K 7/14 | (2006.01) |
| H05K 5/02 | (2006.01) |
| H01R 12/70 | (2011.01) |
| H01R 13/66 | (2006.01) |
| H01R 13/64 | (2006.01) |
| H01R 13/627 | (2006.01) |
| H05K 7/10 | (2006.01) |
| H05K 5/00 | (2006.01) |
| F21S 8/02 | (2006.01) |

(Continued)

(52) U.S. Cl.
CPC ............ *H05K 5/0286* (2013.01); *F21S 8/026* (2013.01); *F21V 23/003* (2013.01); *F21V 29/67* (2015.01); *H01R 12/7088* (2013.01); *H01R 13/6271* (2013.01); *H01R 13/64* (2013.01); *H01R 13/6675* (2013.01); *H05K 5/0026* (2013.01); *H05K 5/0221* (2013.01); *H05K 7/10* (2013.01); *F21Y 2115/10* (2016.08)

(58) Field of Classification Search
None
See application file for complete search history.

(56) References Cited

U.S. PATENT DOCUMENTS

| | | | | | |
|---|---|---|---|---|---|
| 4,420,207 | A | * | 12/1983 | Nishikawa | ........... H01R 13/193 439/368 |
| 5,757,144 | A | * | 5/1998 | Nilssen | ............... H05B 41/245 315/209 R |

(Continued)

*Primary Examiner* — Xanthia C Cunningham
(74) *Attorney, Agent, or Firm* — Jay M. Brown

(57) ABSTRACT

A field replaceable power supply cartridge is provided for coupling with a socket. The cartridge has a latch mechanism that can be actuated by the user to couple the cartridge to the socket, such that latches of the cartridge releasably engage recessed portions in the socket. The cartridge has a key feature that corresponds to a key feature on the socket, allowing the cartridge to be coupled to the socket in only one orientation, thereby preventing the incorrect electrical connection between the cartridge and the socket. The cartridge can have a multi-pin electrical connector for coupling to a corresponding connector on the socket. The socket can be a relatively short socket, where the electrical wires are bottom fed, or can be a relatively tall socket, where the electrical wires are side fed via one or more openings in the body of the socket.

25 Claims, 13 Drawing Sheets

Related U.S. Application Data

(60) Provisional application No. 61/765,257, filed on Feb. 15, 2013.

(51) Int. Cl.
*F21V 23/00* (2015.01)
*F21V 29/67* (2015.01)
*F21Y 115/10* (2016.01)

(56) References Cited

U.S. PATENT DOCUMENTS

| | | | | |
|---|---|---|---|---|
| 6,198,233 B1* | 3/2001 | McConaughy | F21V 23/02 | 315/209 R |
| 6,244,877 B1* | 6/2001 | Asao | H01R 9/2466 | 361/760 |
| 6,392,360 B2* | 5/2002 | McConaughy | F21V 23/02 | 315/209 R |
| 6,752,645 B2* | 6/2004 | Nakamura | H01L 23/4093 | 257/E23.086 |
| 7,098,397 B2* | 8/2006 | Lange | H02G 3/10 | 174/50 |
| 7,149,089 B2* | 12/2006 | Blasko | H01R 13/521 | 361/752 |
| 7,234,950 B1* | 6/2007 | Wickett | H01R 13/504 | 439/247 |
| 7,458,820 B2* | 12/2008 | Ohta | G01R 1/0483 | 439/331 |
| 7,467,888 B2* | 12/2008 | Fiene | H01R 31/065 | 362/221 |
| 7,537,464 B2* | 5/2009 | Brandenburg | H01R 4/2404 | 439/76.1 |
| 7,559,784 B2* | 7/2009 | Hsiao | H05K 7/1053 | 439/331 |
| 7,785,124 B2* | 8/2010 | Lin | G01R 1/0458 | 439/330 |
| 7,828,576 B2* | 11/2010 | Lin | G01R 1/0466 | 439/331 |
| 8,344,602 B2* | 1/2013 | Lai | F21V 19/0025 | 313/46 |
| 8,888,506 B2* | 11/2014 | Nishimura | H01R 12/7082 | 439/74 |
| 2001/0053628 A1* | 12/2001 | Hayakawa | H05K 7/10 | 439/526 |
| 2002/0106925 A1* | 8/2002 | Yamagishi | H05K 7/1007 | 439/331 |
| 2004/0005800 A1* | 1/2004 | Hou | H05K 7/10 | 439/342 |
| 2004/0218372 A1* | 11/2004 | Hamasaki | G02B 6/43 | 361/767 |
| 2005/0032402 A1* | 2/2005 | Takanashi | B60T 8/3675 | 439/76.2 |
| 2007/0238327 A1* | 10/2007 | Hsu | G01R 31/2863 | 439/70 |
| 2008/0076272 A1* | 3/2008 | Hsu | H05K 7/1061 | 439/55 |
| 2008/0112121 A1* | 5/2008 | Cheng | G06F 1/188 | 361/601 |
| 2008/0157112 A1* | 7/2008 | He | F21K 9/233 | 257/98 |
| 2009/0317988 A1* | 12/2009 | Lin | G01R 1/0466 | 439/68 |
| 2010/0015821 A1* | 1/2010 | Hsu | H01L 23/4093 | 439/66 |
| 2010/0072505 A1* | 3/2010 | Gingrich | F21K 9/00 | 257/99 |
| 2010/0230709 A1* | 9/2010 | Kanno | H01R 13/20 | 257/99 |
| 2011/0097921 A1* | 4/2011 | Hsu | G01R 1/0458 | 439/331 |
| 2011/0180841 A1* | 7/2011 | Chang | F21K 9/00 | 257/99 |
| 2011/0306219 A1* | 12/2011 | Swanger | H05K 3/325 | 439/55 |
| 2012/0018754 A1* | 1/2012 | Lowes | F21V 3/0481 | 257/98 |
| 2012/0021623 A1* | 1/2012 | Gorman | H01H 11/0006 | 439/76.1 |
| 2012/0175653 A1* | 7/2012 | Weber | F21V 15/01 | 257/98 |
| 2012/0187830 A1* | 7/2012 | Shum | H05K 1/021 | 315/32 |
| 2012/0286319 A1* | 11/2012 | Lee | H01L 33/642 | 257/99 |
| 2012/0292660 A1* | 11/2012 | Kanno | H01L 33/647 | 257/99 |
| 2013/0095673 A1* | 4/2013 | Brandon | H01R 12/58 | 439/55 |
| 2014/0134880 A1* | 5/2014 | Yeh | H05K 7/00 | 439/620.15 |
| 2014/0159077 A1* | 6/2014 | Kuenzler | H05K 1/0209 | 257/89 |

* cited by examiner

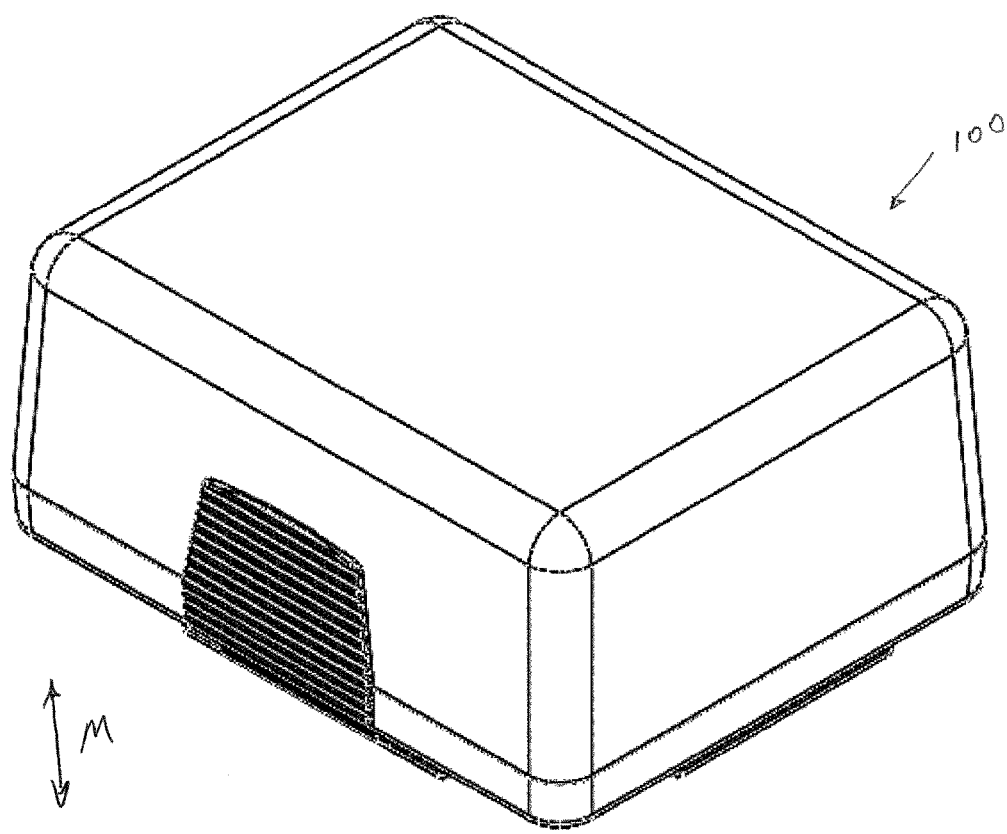
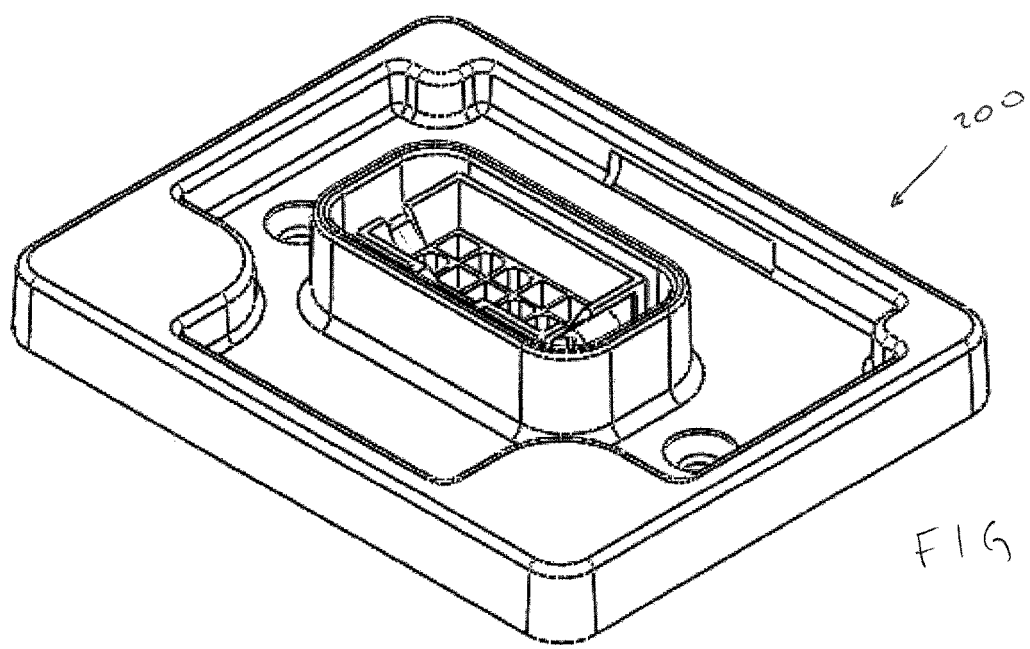
FIG 12

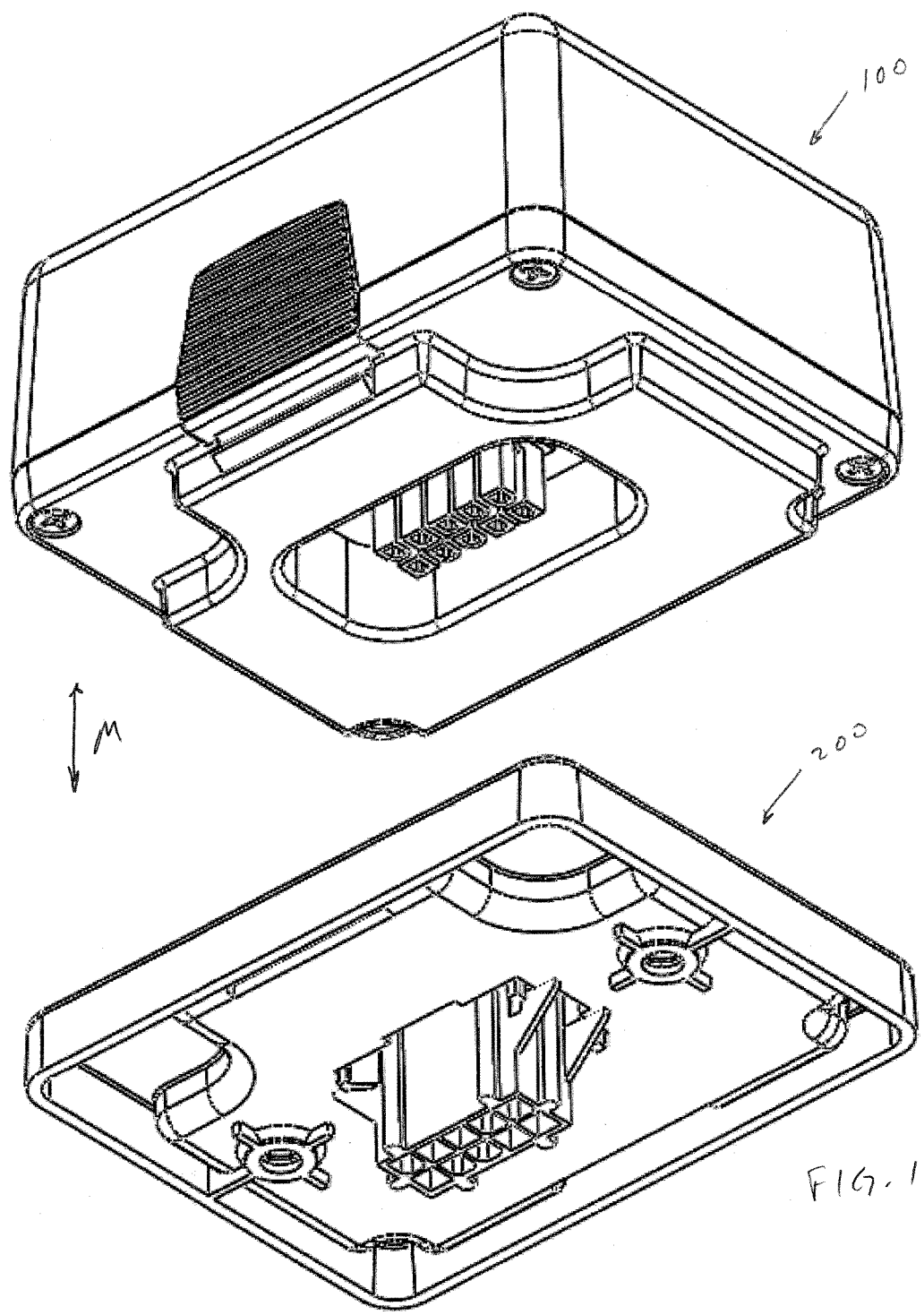

FIELD REPLACEABLE POWER SUPPLY CARTRIDGE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of U.S. Provisional Application No. 61/765,257, filed Feb. 15, 2013 and titled FIELD REPLACEABLE POWER SUPPLY CARTRIDGE, the entirety of which is incorporated by reference and should be considered a part of this specification.

BACKGROUND

Field

The invention is directed to a field replaceable power supply cartridge and more particularly to a field replaceable power supply cartridge for use within lighting fixture assemblies.

Description of the Related Art

There are many different electric lighting technologies, which all require a power supply, a transformer or a ballast (e.g., LED, HID, Compact Fluorescent, linear fluorescent, low-voltage halogen, etc.). All of the above mentioned lighting technologies can be used in many different form factors, such as recessed down lights, pendants, sconces, chandeliers, exterior lighting, high-bay warehouse fixtures, landscape lighting, cove lighting, linear lighting, under-cabinet lighting, ceiling mounted fixtures, track lighting, etc. One of the most common types of light fixtures which use an integrated power supply is recessed down lights.

Recessed down lights are a popular and elegant way to provide lighting to a space, with the recessed down lights mounted in a ceiling so that only a trim ring and the light bulb is open to view, while the rest of the components, including the power supply (e.g. LED driver, fluorescent ballast, HID ballast or step down transformer), are disposed on the other side of the ceiling and hidden from view. The power supply is typically housed in a sheet metal or plastic box. Power supplies fail over time, for example, due to the exposure of the electronics to heat generated by the lighting system.

One drawback with conventional power supplies is that they can be difficult and time consuming to replace because of the limited access space through the ceiling opening where the recessed down light is mounted. In a typical recessed down light, replacing the power supply includes reaching through the aperture in the ceiling and around the lighting assembly, removing wing nuts or thumb nuts (or other types of threaded fasteners) that attach the power supply to the lighting assembly, removing the power supply through the ceiling aperture along with the lead wires that wire the power supply to the lighting assembly, cutting and stripping the wires and attaching them to the new power supply, inserting the new power supply through the ceiling aperture, and coupling the new power supply to the lighting assembly with the thumb screws or thumb nuts. Because all of this is done through the limited space provided by the ceiling aperture for the recessed down light, a user has to perform all of these steps with a single hand, which makes the process take longer, particularly because of all the different parts and steps that are involved in replacing the power supply. And in most cases the user cannot see the power supply within the recessed down light, and therefore has to remove and replace the fasteners without a line of sight to the power supply assembly while performing these steps.

Accordingly, there is a need for an improved and simpler system and method for replacing a power supply within a light fixture assembly.

SUMMARY

In one embodiment, a field replaceable power supply cartridge is provided for coupling with a socket. The cartridge can have a latch mechanism that can be actuated by the user to couple the cartridge to the socket, such that the one or more latches of the cartridge releasably engage one or more recessed portions in the socket. The cartridge can have a key feature that corresponds to a key feature on the socket, allowing the cartridge to be coupled to the socket in only one orientation, thereby preventing the incorrect electrical connection between the cartridge and the socket. The cartridge can have a multi-pin electrical connector for coupling to a corresponding connector on the socket. The socket can be a relatively short socket, where the electrical wires are bottom fed (e.g., from an electrical box), or can be a relatively tall socket, where the electrical wires are side fed via one or more openings in the body of the socket. The socket can be made of a thermally conductive material (e.g., aluminum) for transferring heat from the cartridge to the socket when the two are coupled to each other, such that the socket can provide for a thermal connection as well as an electrical connection between the cartridge and the socket.

In one embodiment, the field replaceable power supply cartridge can be an LED driver, such as a replaceable LED driver cartridge for use with down lighting (e.g., recessed lighting) systems. In another embodiment, the field replaceable power supply cartridge can be a ballast, such as a ballast for a fluorescent lighting system, a ballast for a compact fluorescent lighting system, a ballast for an HID (high intensity discharge) lighting system, or used in connection with any other light source or lighting system that uses a power supply or ballast. In another embodiment, the field replaceable power supply cartridge can be an LED driver cartridge for use within an LED light fixture assembly. In still another embodiment, the field replaceable power supply cartridge can be a transformer.

In accordance with one aspect of the present invention, a field replaceable LED driver system is provided. The system comprises an LED driver cartridge having a cartridge body, the cartridge body having a key feature defined on a bottom side of the cartridge body. The system also comprises one or more gripping members spring loaded relative to a portion of the cartridge body, the one or more gripping members configured to actuate one or more latches and configured to be pushed by a user to move the one or more latches inward relative to the cartridge body. The system also comprises a printed circuit board coupled to the cartridge body and an electrical connector on the bottom side of the cartridge body electrically connected to the printed circuit board. The key feature facilitates installment of the LED driver in a single predetermined orientation.

In accordance with another aspect of the present invention, a field replaceable LED driver system is provided. The system comprises an LED driver cartridge body, the cartridge body having a key feature defined on a bottom side of the cartridge body. The system also comprises one or more gripping members spring loaded relative to a portion of the cartridge body, the one or more gripping members configured to actuate one or more latches and configured to be pushed by a user to move the one or more latches inward relative to the cartridge body. The system also comprises an electrical connector on the bottom side of the cartridge body. The system also comprises a socket having a socket body coupleable to an electrical box and configured to releasably couple to the cartridge body, the socket body comprising one or more recess portions configured to releasably engage the one or more latches, the socket body having a key portion defined on a top side thereof, the key portion having a shape corresponding to a shape of the key feature such that the LED driver cartridge body couples to the socket in the single predetermined orientation. The key feature of the cartridge body and the key portion of the socket facilitate coupling of the LED driver cartridge body to the socket body in a single predetermined orientation.

BRIEF DESCRIPTION OF THE DRAWINGS

FIG. 12 is a perspective exploded top view of the field replaceable power supply cartridge of FIG. 9 and socket of FIGS. 5-6.

FIG. 13 is a perspective exploded bottom view of the field replaceable power supply cartridge of FIG. 9 and socket of FIGS. 5-6.

DETAILED DESCRIPTION

The embodiments disclosed below describe an improved system and method for a field replaceable power supply cartridge. In one embodiment, the field replaceable power supply cartridge can be an LED driver cartridge, such as a replaceable LED driver cartridge for use with down lighting (e.g., recessed lighting) systems. In another embodiment, the field replaceable power supply cartridge can be a ballast, such as a ballast for a fluorescent lighting system, a ballast for a compact fluorescent lighting system, a ballast for an HID (high intensity discharge) lighting system, or used in connection with any other light source or lighting system that uses a power supply or ballast. In another embodiment, the field replaceable power supply cartridge can be an LED driver cartridge for use within an LED light fixture assembly. In still another embodiment, the field replaceable power supply cartridge can be a transformer (e.g., step down transformer).

One of skill in the art will recognize that the embodiments disclosed herein for a field replaceable power supply cartridge can be used as part of many lighting technologies, such as those discussed above. Additionally, the field replaceable power supply cartridge can be used in many different form factors, such as recessed down lights, pendants, sconces, chandeliers, exterior lighting, high-bay warehouse fixtures, landscape lighting, cove lighting, linear lighting, under-cabinet lighting, ceiling mounted fixtures, track lighting, etc.

Figure 1:
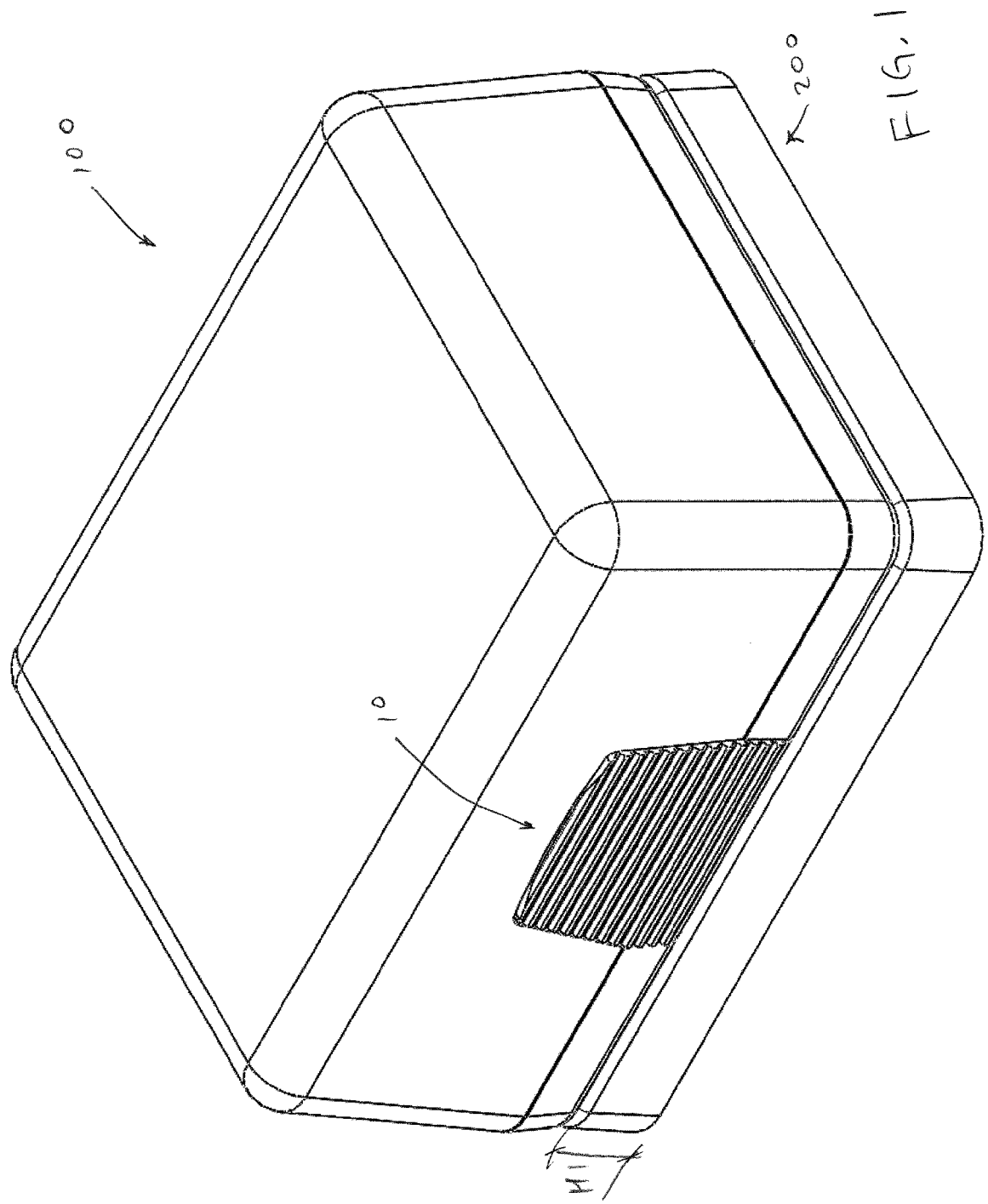
FIG. 1 is a top perspective view of one embodiment of a field replaceable power supply cartridge attached to one embodiment of a socket.
Figure 2:
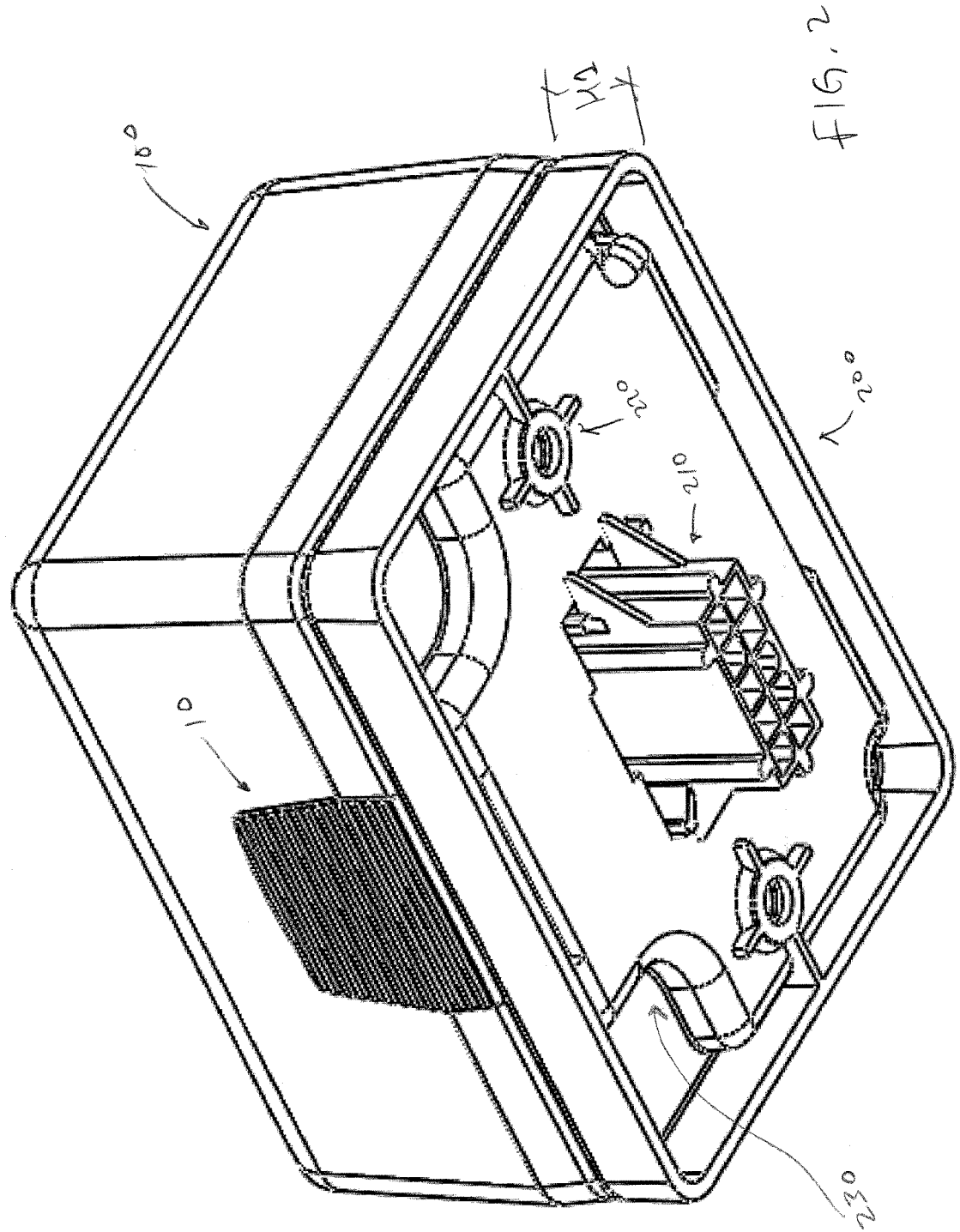
FIG. 2 is a bottom perspective view of the field replaceable power supply cartridge and socket of FIG. 1.

FIGS. 1-2 show one embodiment of a field replaceable power supply cartridge 100 (hereinafter "cartridge") coupled to one embodiment of a socket 200. In the illustrated embodiment, the cartridge 100 can be generally rectangular in shape. However, in other embodiments, the cartridge 100 can have other suitable shapes, such as square, round, etc. The cartridge 100 can have one or more gripping members 10 allowing a user to grip the cartridge 100 (e.g., grip with the user's fingers). In the illustrated embodiment, the cartridge 100 has two gripping members 10 on opposite sides of the cartridge 100. However, in other embodiments, the cartridge 100 can have more or fewer gripping members 10.

Figure 5:
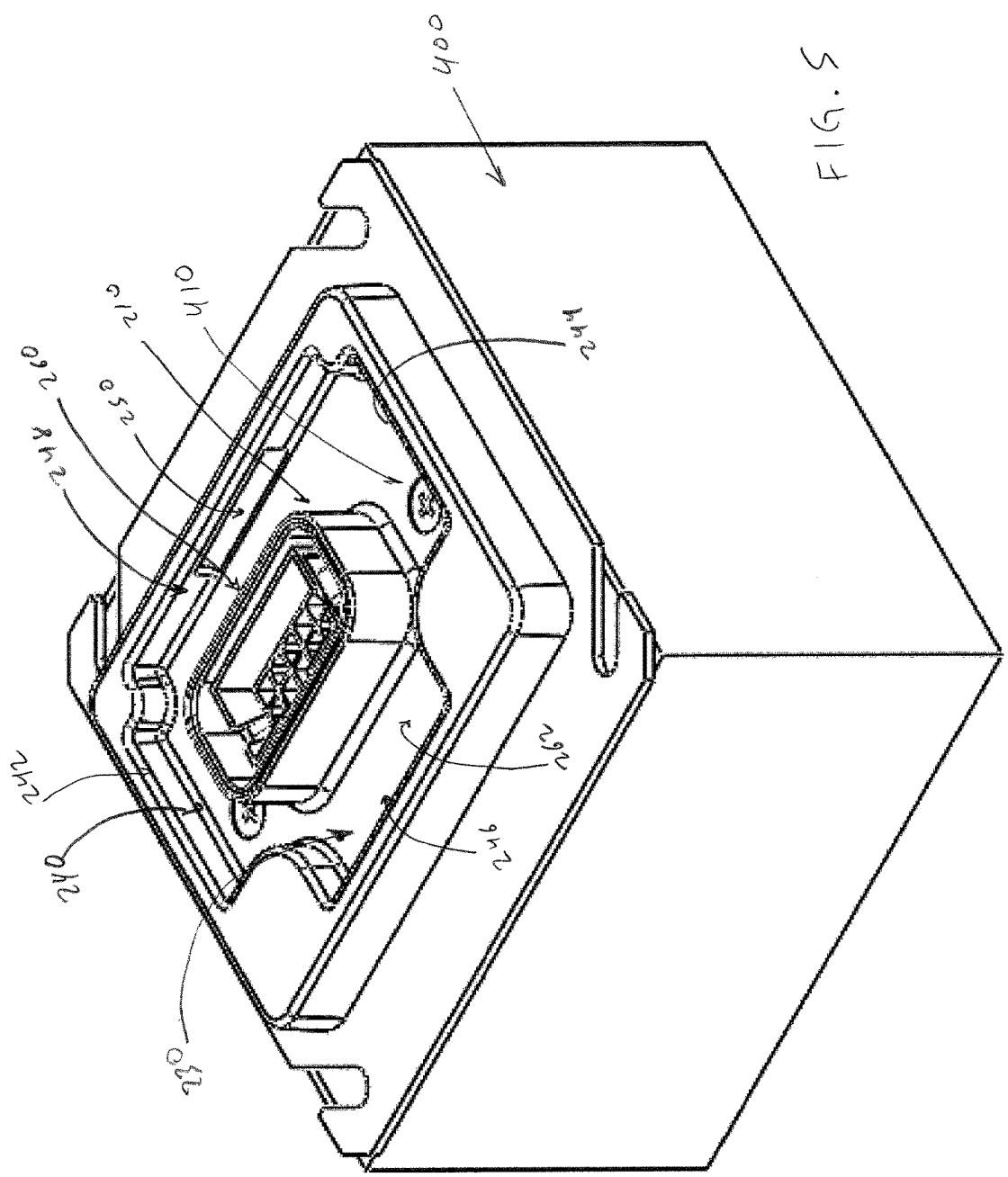
FIG. 5 is a top perspective view of one embodiment of a socket installed on an electrical box.
Figure 6:
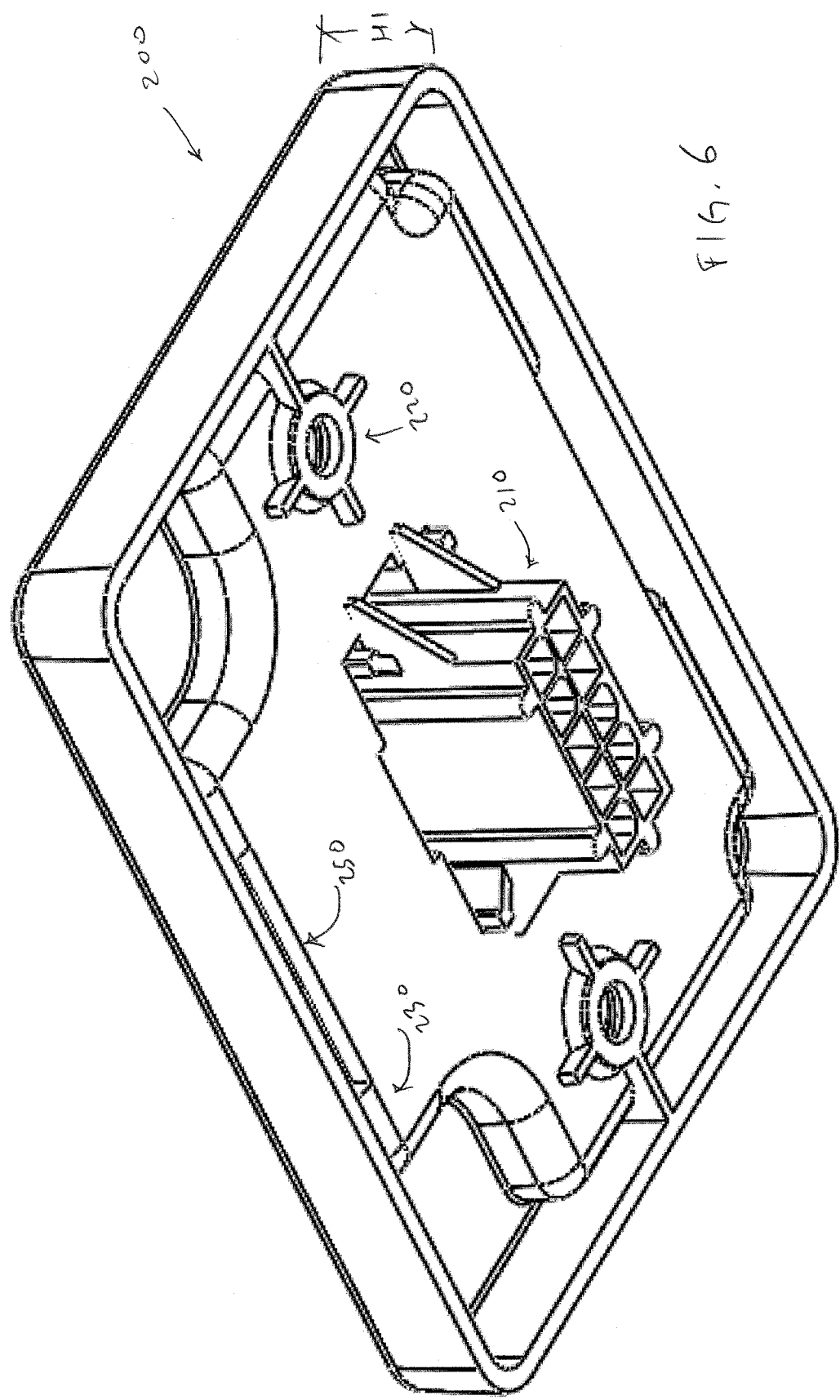
FIG. 6 is a bottom perspective view of the socket of FIG. 5.

As shown in FIGS. 1-2, the socket 200 can have generally the same shaped perimeter as the cartridge 100. In another embodiment, the socket 200 can have a larger or smaller perimeter than the cartridge 100. In the illustrated embodiment, the socket 200 is a relatively short socket with a height H1. The socket 200 can be attached to an electrical box 400, as shown in FIG. 5, which can house one or more wires that couple to a multi-pin connector 210 of the socket 200 for coupling with a multi-pin connector 110 of the cartridge 100. The multi-pin connectors 110, 210 allow the cartridge 100 to provide multiple functions to the lighting system. For example, some of the pins of the connectors 110, 210 can take in house power, some of the pins of the connectors 110, 210 can provide driving control for the lighting system, some of the pins of the connectors 110, 210 could be used for dimming of the lighting system, some of the pins can be used to supply power and control to an active cooling system (e.g., fan) to cool the driver 100, and some of the pins of the connectors 110, 210 can communicate control signals to and from the driver 100.

In one embodiment, the socket 200 can be made of a thermally conductive material, such as Aluminum. However, the socket 200 can be made of other suitable materials (e.g., other metals or plastics). Additionally, in some embodiments, a thermal interface member (e.g., thermal pad) can be disposed between the cartridge 100 and the socket 200 to facilitate heat transfer between the cartridge 100 and the socket 200. That is, in some embodiments, the connection between the cartridge 100 and the socket 200 can be a thermal connection as well as an electrical connection.

With continued references to FIG. 2, the socket 200 can have one or more apertures 220 that can receive a fastener (e.g., screw) 410 therethrough to couple the socket 200 to, for example, the electrical box 400 (see FIG. 5). Additionally, the socket 200 can have a key feature 230, further described below, that allows the cartridge 100 to couple to the socket 200 in only one orientation, thereby preventing the erroneous coupling of the cartridge 100 to the socket 200, which may result in an incorrect alignment between the male and female multi-pin connectors and improper electrical connection between the cartridge 100 and the socket 200.

With continued reference to FIGS. 2 and 5, the short socket 200 can be coupled to the electrical box 400, and the electrical wires housed in the electrical box 400. The wires can be bottom fed to the connector 210 of the socket 200 from the electrical box 400. The electrical box 400 can be made of metal. In an embodiment where the cartridge 100 is a power supply cartridge (e.g., LED driver cartridge for a down lighting system), the electrical box 400 can be mounted above the ceiling and out of view to the user. In another embodiment, the electrical box may take the form of a cavity created within the light fixture housing (e.g. an internal wall of the light fixture that the socket can be mounted to, with a hollow cavity behind the wall). In yet another embodiment, the socket can be mounted to a wall of the light fixture housing or any surface of the light fixture housing.

Figure 3:
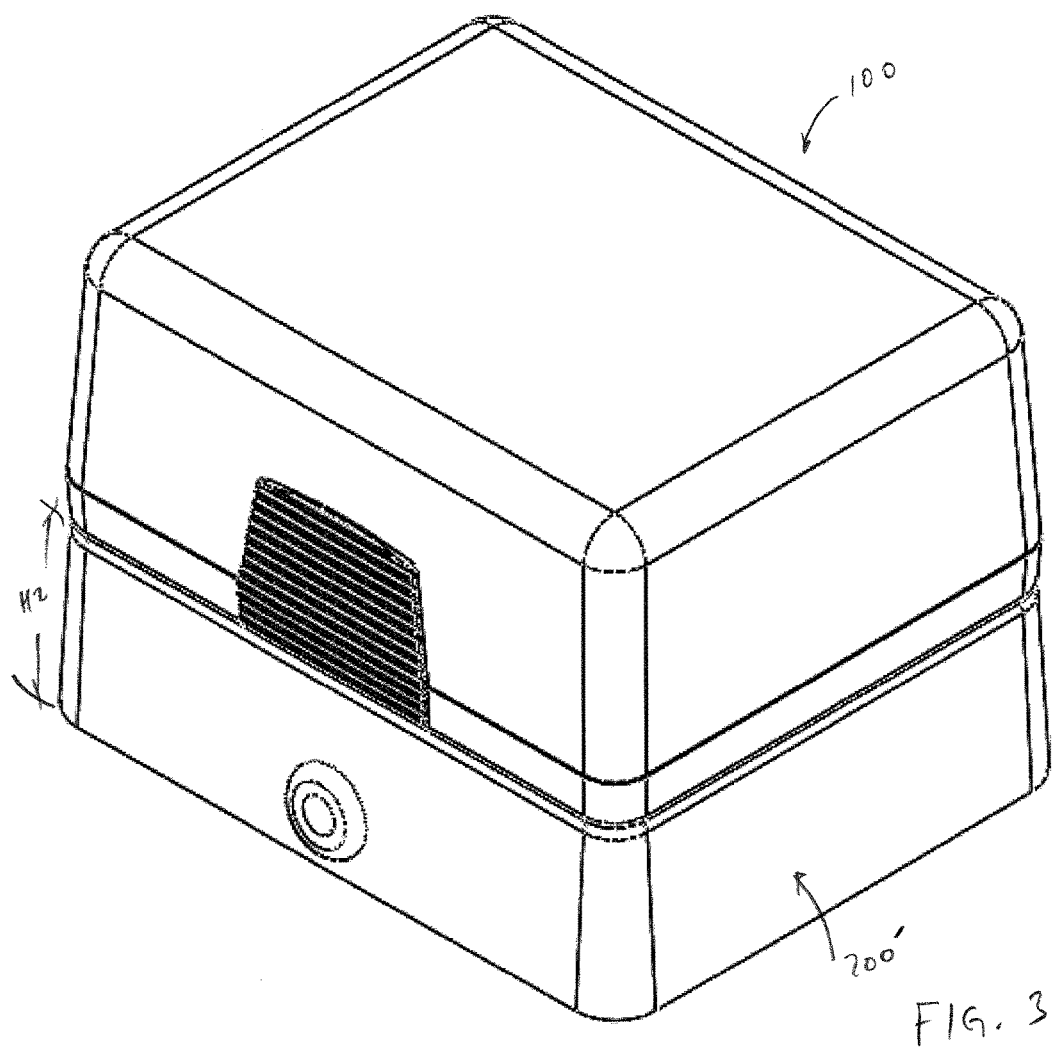
FIG. 3 is a top perspective view of another embodiment of a field replaceable power supply cartridge coupled to another embodiment of a socket.
Figure 4:
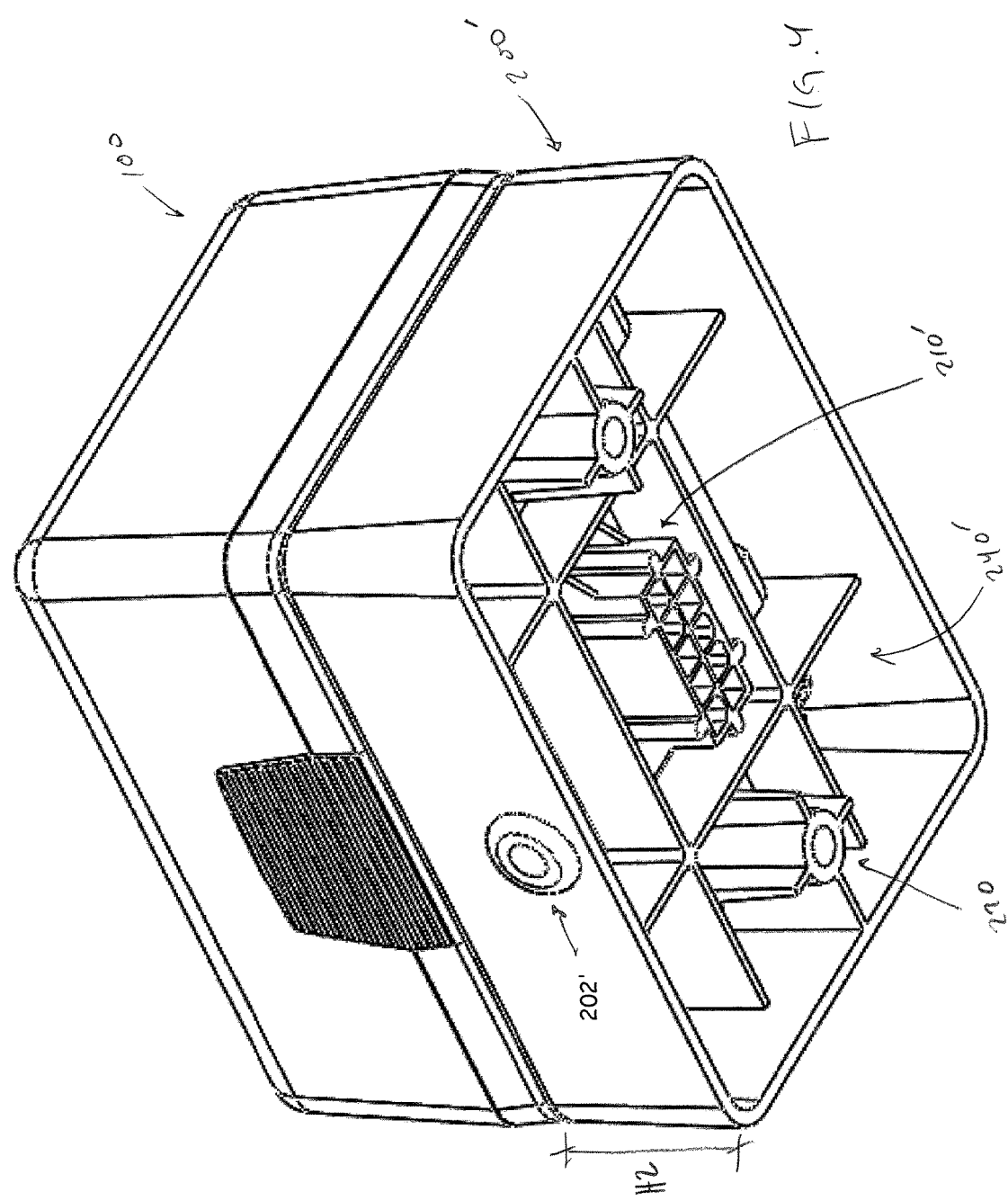
FIG. 4 is a bottom perspective view of the field replaceable power supply cartridge and socket of FIG. 3.

FIGS. 3-4 show the cartridge 100 coupled to another embodiment of a socket 200'. The socket 200' has a height H2 that is greater than the height H1 of the socket 200, so that the socket 200' is a relatively tall socket. Like the socket 200, the socket 200' can include a multi-pin connector 210' and one or more apertures 220' that can receive a fastener (e.g., screw) therethrough to couple the socket 200' to another component (e.g., to mount the socket 200' to a structural beam above the ceiling). The socket 200' can also include one or more openings 202' sized to receive one or more wires therethrough and into an inner space 240' of the socket 200' so the wires can be connected to the connector 210'. Unlike the socket 200, the one or more openings 202' allow side feeding of the wires into the socket 200'. The socket 200' can be made of a thermally conductive material, such as Aluminum. However, other suitable materials can be used (e.g., other metals, other thermally conductive plastic materials or other types of plastics).

FIG. 5 shows the key feature 230 of the socket 200. The socket 200 can have a recessed portion 240 defined at least in part by a first side wall 242, a second side wall 244, a third side wall 246 and a fourth side wall 248. In the illustrated embodiment, the first and second side walls 242, 244 can have the same length, but the third and fourth sidewalls 246, 248 can have different lengths, so that a corresponding key feature 130 (described further below in with respect to FIG. 10) of the cartridge 100 can only be coupled to the key feature 230 of the socket 200 in one orientation, such that the multi-pin electrical connector 210 of the socket 200 can only couple to the multi-pin electrical connector 110 of the cartridge 100 in one orientation, thereby preventing an incorrect electrical connection between the cartridge 100 and socket 200. However, the key feature 230 can have other suitable configurations and still result in allowing the cartridge 100 to couple to the socket 200 in only one orientation. For example, in one embodiment, three of the four side surfaces of the recessed portion 240 can have the same length and the fourth side surface can have a different length. Advantageously, the key feature 230 allows a user to easily determine whether the cartridge 100 is in the correct orientation relative to the socket 200, and to position the cartridge 100 in the correct orientation relative to the socket 200 during the installation process.

The socket 200 also has one or more recesses 250 in one or more of the walls 242, 244, 246, 248, the one or more recesses 250 sized to releasably receive a corresponding latch 150 (see FIG. 10) of the cartridge 100. In the illustrated embodiment, the socket 200 can have two recesses 250 on the third and fourth sidewalls 246, 248 for releasably receiving corresponding latches 150 of the cartridge 100. However, in other embodiments, the socket 200 can have more or fewer recesses 250. Additionally, the recessed portion 240 of the socket 200 can define a protruding portion 260 of the electrical connector 210, which extends from a bottom surface 262 of the recessed portion 240. In one embodiment, a thermal interface member (e.g., thermal pad) can be inserted into the recessed portion 240 so that is contacts the bottom surface 262, such that the thermal interface member is disposed between the bottom surface 262 of the socket 200 and a base surface 162 of the cartridge 100 (see FIG. 10) when the cartridge 100 is coupled to the socket 200, to thereby facilitate heat transfer between the cartridge 100 and the socket 200. In another embodiment, the thermal interface member can be excluded and the base surface 162 of the cartridge 100 can contact the bottom surface 262 of the recessed portion 240 directly to transfer heat from the cartridge 100 to the socket 200. Heat transfer between the cartridge 100 and the socket 200 is not a necessary function of the invention. It can be used to help keep the power supply cool, or in other embodiments the cartridge and the socket can be made of plastic and there would be no thermal connection between the cartridge 100 and the socket 200.

Figure 7:
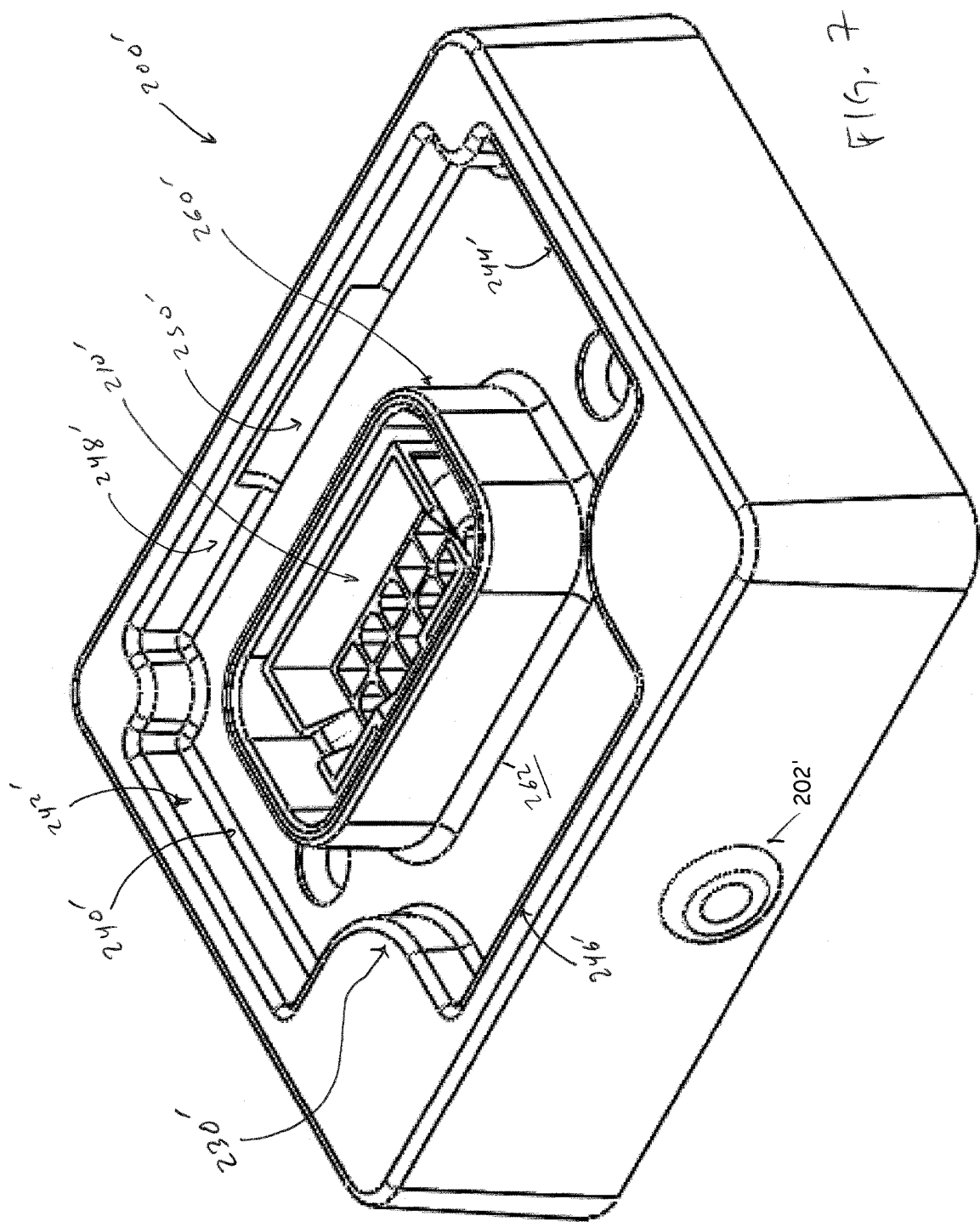
FIG. 7 is a top perspective view of another embodiment of a socket.
Figure 8:
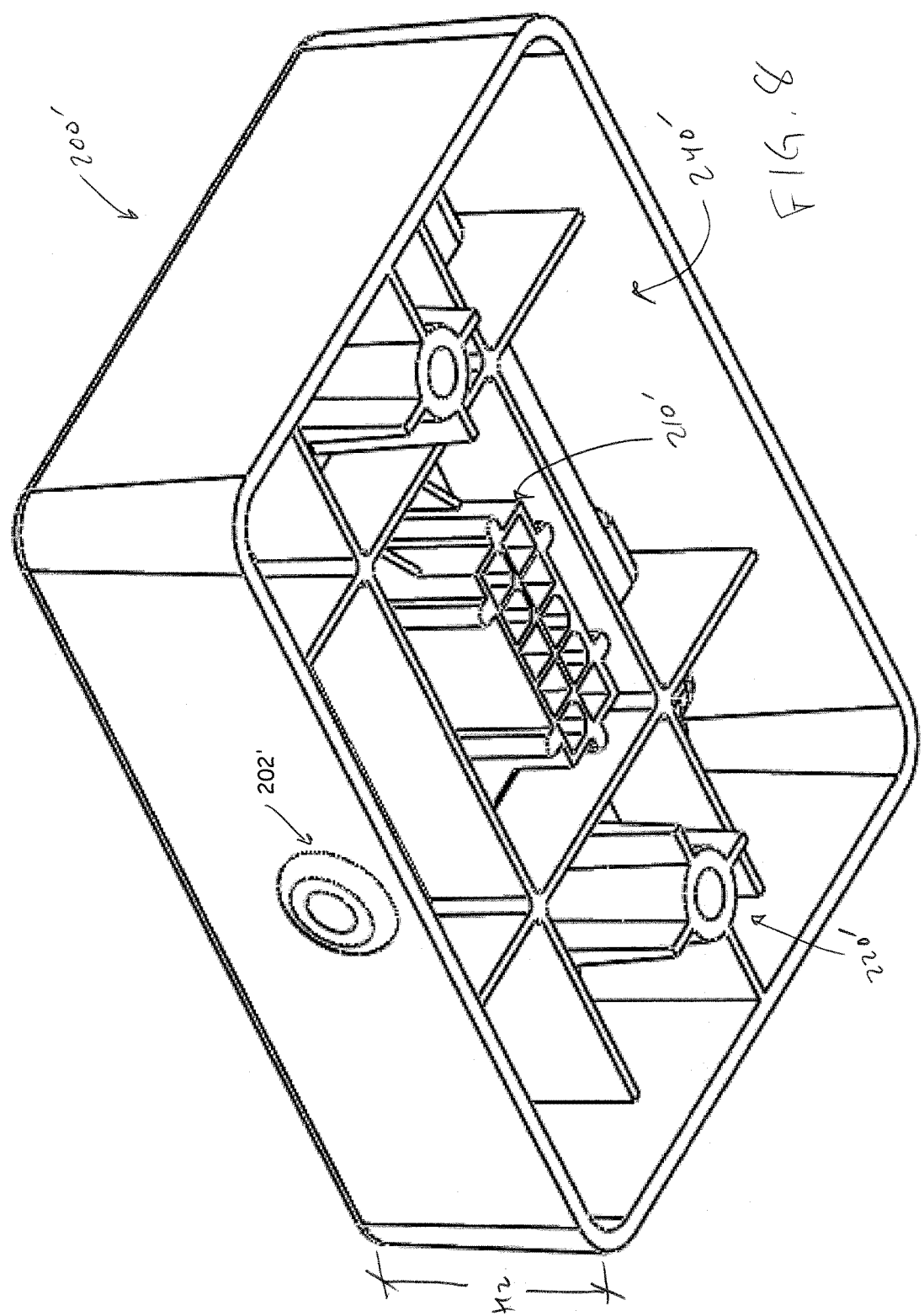
FIG. 8 is a bottom perspective view of the socket of FIG. 7.

FIG. 7 shows the key feature 230' of the socket 200' (the tall socket). The socket 200' can have a recessed portion 240' defined at least in part by a first side wall 242', a second side wall 244', a third side wall 246' and a fourth side wall 248'. In the illustrated embodiment, the first and second side walls 242', 244' can have the same length, but the third and fourth sidewalls 246', 248' can have different lengths, so that a corresponding key feature 130 (described further below in with respect to FIG. 10) of the cartridge 100 can only be coupled to the key feature 230' of the socket 200' in one orientation, such that the multi-pin electrical connector 210' of the socket 200' can only couple to the multi-pin electrical connector 110 of the cartridge 100 in one orientation, thereby preventing an incorrect electrical connection between the cartridge 100 and socket 200'. However, the key feature 230' can have other suitable configurations and still result in allowing the cartridge 100 to couple to the socket 200' in only one orientation. For example, in one embodiment, three of the four side surfaces of the recessed portion 240' can have the same length and the fourth side surface can have a different length. Advantageously, the key feature 230' allows a user to easily determine whether the cartridge 100 is in the correct orientation relative to the socket 200', and to position the cartridge 100 in the correct orientation relative to the socket 200' during the installation process.

The socket 200' also has one or more recesses 250' in one or more of the walls 242', 244', 246', 248', the one or more recesses 250' sized to releasably receive the corresponding latch 150 (see FIG. 10) of the cartridge 100. In the illustrated embodiment, the socket 200' can have two recesses 250' on the third and fourth sidewalls 246', 248' for releasably receiving corresponding latches 150 of the cartridge 100. However, in other embodiments, the socket 200' can have more or fewer recesses 250' defined on one or more side surfaces of the recessed portion 240'. Additionally, the recessed portion 240' of the socket 200' can define a protruding portion 260' of the electrical connector 210', which extends from a bottom surface 262' of the recessed portion 240'. In one embodiment, a thermal interface member (e.g., thermal pad) can be disposed in the recessed portion 240' in contact with the bottom surface 262', such that the thermal interface member is disposed between the bottom surface 262' of the socket 200' and the base surface 162 of the cartridge 100 (see FIG. 10) when the cartridge 100 is coupled to the socket 200', to thereby facilitate heat transfer between the cartridge 100 and the socket 200'. In another embodiment, the thermal interface member can be excluded and the base surface 162 of the cartridge 100 can contact the bottom surface 262' of the recessed portion directly to transfer heat from the cartridge 100 to the socket 200'. Heat transfer between the cartridge 100 and the socket 200' is not a necessary function of the invention. It can be used to help keep the power supply cool, or in other embodiments the cartridge and the socket can be made of plastic and there would be no thermal connection between the cartridge 100 and the socket 200'.

Figure 9:
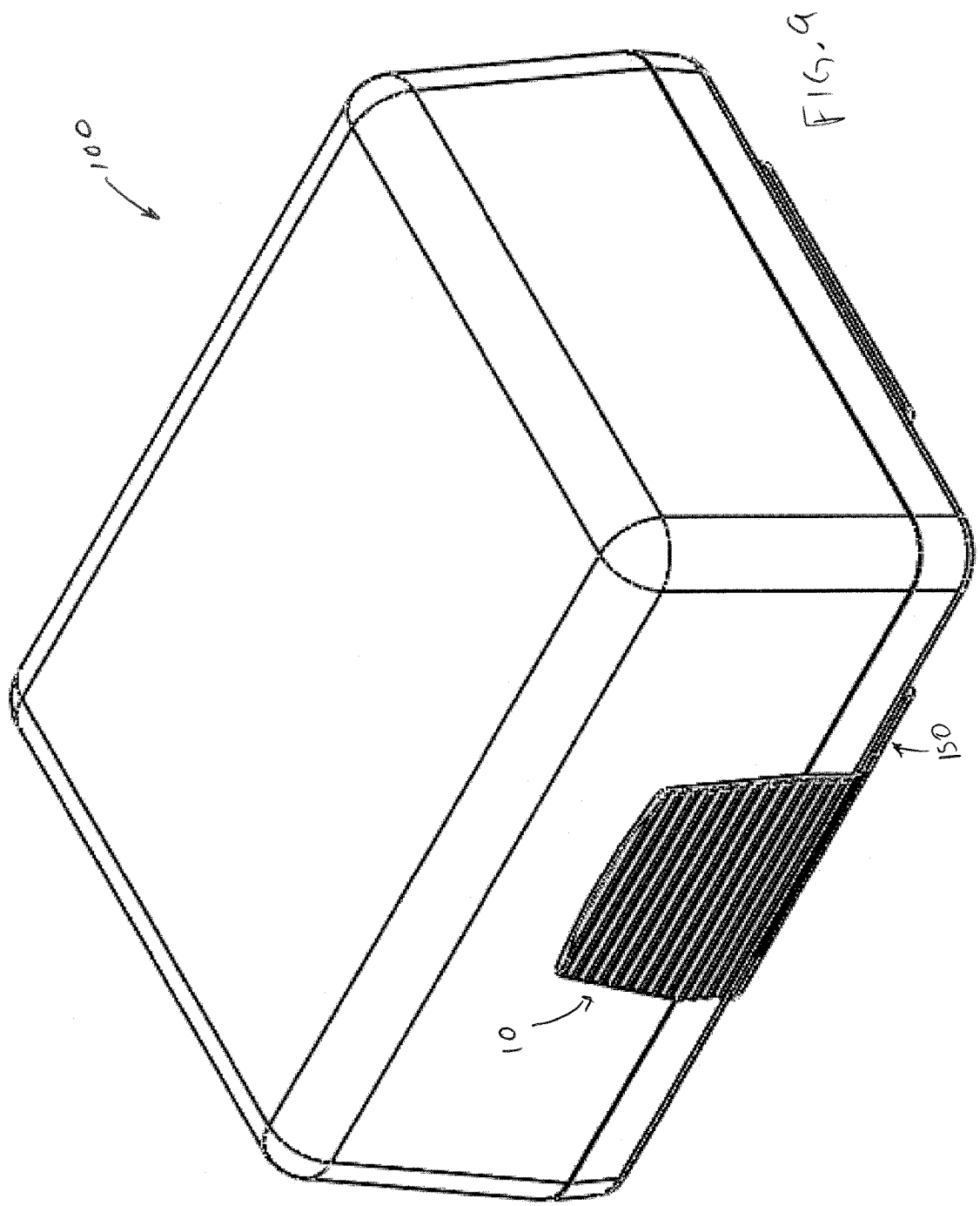
FIG. 9 is a top perspective view of one embodiment of a field replaceable power supply cartridge.
Figure 10:
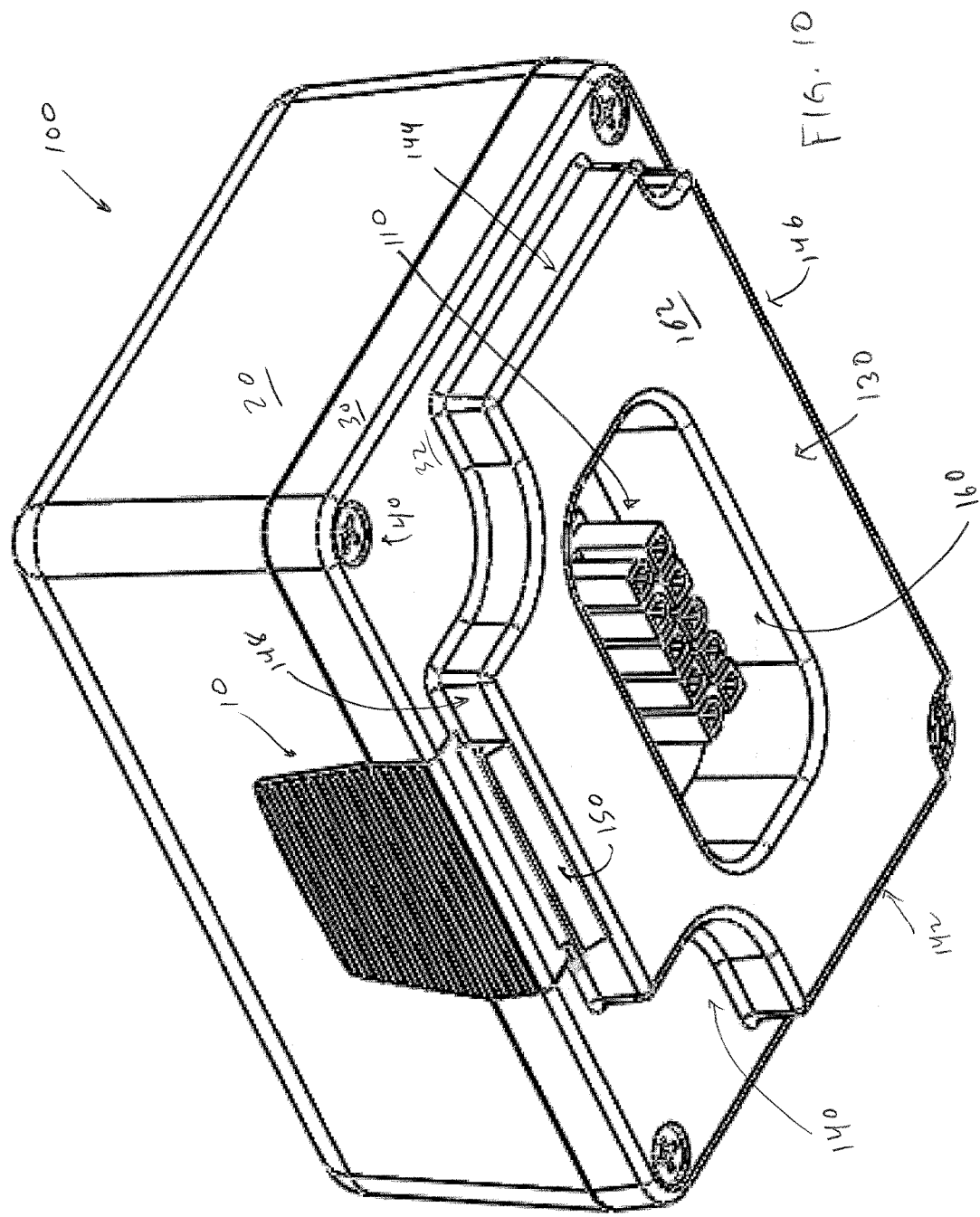
FIG. 10 is a bottom perspective view of the field replaceable power supply cartridge of FIG. 9.
Figure 11:
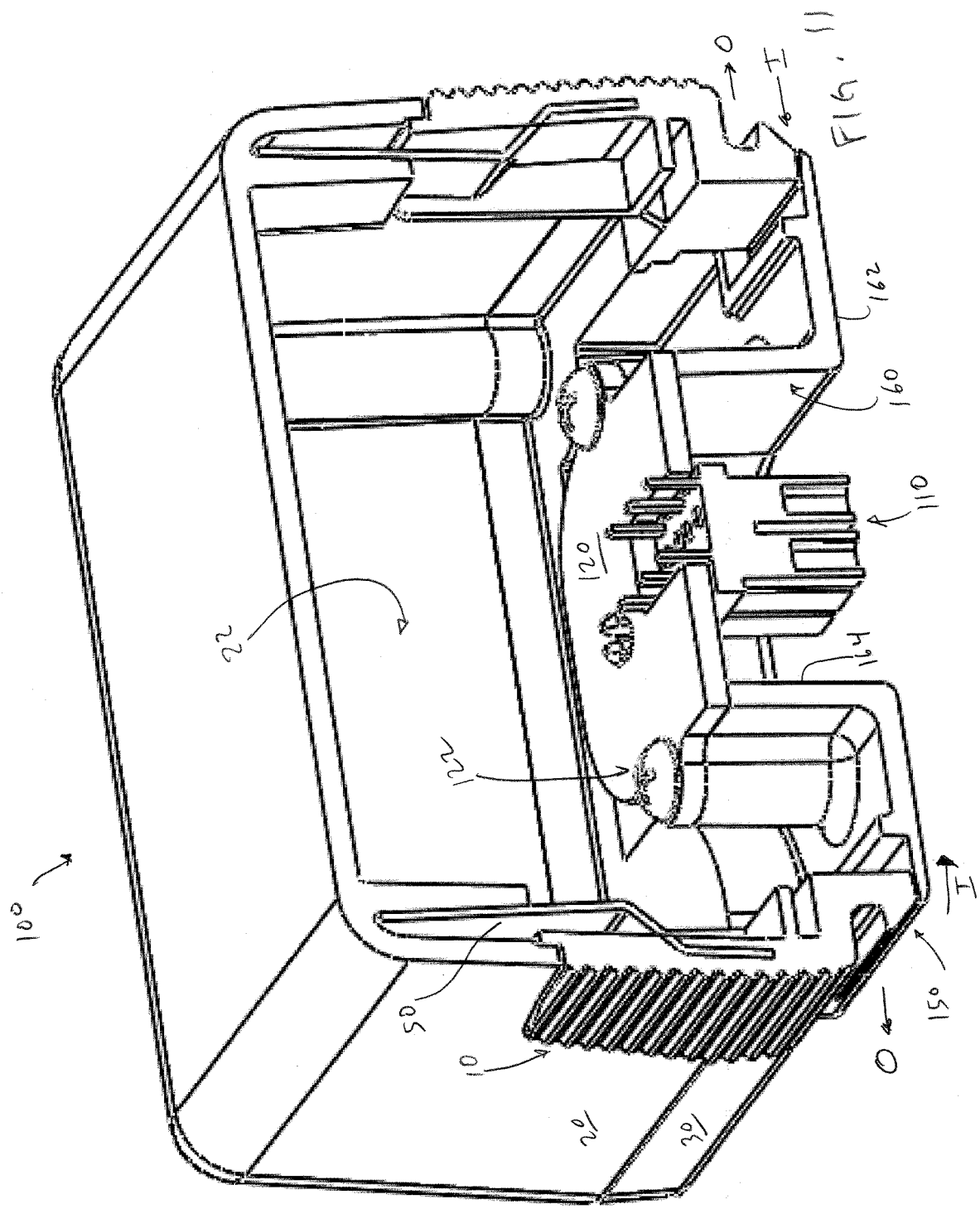
FIG. 11 is a cross-sectional side view of the field replaceable power supply cartridge of FIG. 9.

FIGS. 9-11 show one embodiment of the cartridge 100. The cartridge 100 can have one or more gripping members 10 and one or more latches 150 that can be actuated by a user via the gripping members 10. The cartridge can have a top portion 20 attached to a bottom portion 30 with one or more fasteners 40 (e.g., screws). In another embodiment, the top 20 and bottom 30 portions can be attached using an adhesive or other suitable mechanisms (e.g., ultrasonic welding, etc.). The bottom portion 30 can define a key feature 130 and base surface 162. The key feature 130 can include a protruding portion 140 that protrudes from a surface 32 of the bottom portion 30 and defines a first side surface 142, a second side surface 144 opposite the first side surface 142, a third side surface 146 and a fourth side surface 148 opposite the third side surface 146. In the illustrated embodiment, the first and second side surfaces 142, 144 can have the same length and the third and fourth 146 148 side surfaces can have different lengths. The key feature 130 can have the same profile as the key feature 230, 230' of the socket 200, 200' so that the cartridge 100 can be coupled to the socket 200, 200' in only one orientation.

The protruding portion 140 can define a socket portion 160 sized to receive the protruding portion 260, 260' of the socket 200, 200', so that the connector 110 can electrically connect with the connector 210, 210' on the socket 200, 200'. As shown in FIG. 11, the connector 110 can connect to a PCB 120, which can be mounted with one or more fasteners 122 to a socket wall 164 of the socket 160. The top portion 20 of the cartridge 100 can define a cavity 22 therein. As discussed above, the cartridge 100 can provide a plurality of functions, for example, to a lighting assembly with which it is used (e.g., provide a dimming function, power an active cooling system, etc.).

With continued reference to FIG. 11, the one or more gripping members 10 can be integrated with the latch 150 so that each gripping member 10 has a latch 150 and forms a single piece with the latch 150. The gripping member 10 can be spring loaded relative to the top portion 20 of the cartridge 100 by one or more resilient members 50 (e.g., leaf springs) that bias the gripping member 10 outward relative to the housing of the cartridge 100.

In operation, a user would grip the one or more gripping members 10 and pinch them together or squeeze them together or depress to bias the one or more latches 150 inward relative to the cartridge 100 housing (see arrow I in FIG. 11), allowing the one or more latches 150 to clear the one or more recesses 250, 250' of the socket 200, 200' when the cartridge 100 is coupled to the socket 200, 200'. Once the user had properly aligned the key features 130, 230, 230' of the cartridge 100 and socket 200, 200', and advanced the cartridge 100 relative to the socket 200, 200' to provide the electrical connection between the connector 110 of the cartridge 100 and the connector 210, 210' of the socket 200, 200', the user could release the one or more gripping members 10, allowing the latches 150 to be biased outward relative to the cartridge 100 housing by the one or more resilient members 50 (see arrow O in FIG. 11). This outward movement of the one or more latches 150 causes the one or more latches 150 to engage the one or more recesses 250, 250' of the socket 200, 200' to substantially fixedly maintain the cartridge 100 coupled to the socket 200, 200'. To decouple the cartridge 100 from the socket 200, 200', the user can again grip the one or more gripping members 10 on the cartridge 100 and pinch them together or squeeze them together or depress to bias the one or more latches 150 inward so that they can disengage the one or more recesses 250, 250' in the socket 200, 200', thereby allowing the user to remove the cartridge 100 from engagement with the socket 200, 200'.

In another embodiment, the user need not grip the one or more gripping members 10 to bias the one or more latches 150 inward, and can simply advance the cartridge 100 (in the correct orientation) relative to the socket 200, 200', where the one or more latches 150 have an angled surface that allows the one or more latches 150 to be biased inward as the cartridge 100 is advanced relative to the socket 200, 200' so that the one or more latches 150 clear the side walls 246, 246' and 248, 248' to engage the one or more recesses 250, 250'. In still another embodiment, the one or more resilient members 50 can be excluded, and the one or more gripping members 10 can be an integral part (e.g., one piece) with the top portion 20 of the cartridge 100. The cartridge 100 housing can be made of a material that allows some flexion, so that the user can apply a force to the one or more gripping members 10 to bias the one or more latches 150 inward, thereby allowing the one or more latches 150 to clear the side walls 246, 246' and 248, 248' of the socket 200, 200' for engagement and disengagement with the recesses 250, 250' during installation and removal of the cartridge 100.

FIGS. 12 and 13 show an exploded view of the cartridge 100 and socket 200, and the motion of the cartridge 100 relative to the socket 200 (see arrow M) to couple the cartridge 100 to the socket 200.

Advantageously, the cartridge 100 and socket 200, 200' system disclosed herein elegantly simplifies the process of replacing a power supply cartridge, which can be done by a user without any tools, without the need to cut or strip electrical wires when replacing the cartridge, and without the need to keep track of fasteners that need to be removed or replaced to replace the power supply. Additionally, the cartridge 100 and socket 200, 200' allow the user to easily replace the power supply (e.g., in a down lighting system) where space to the electrical components of the lighting system is very limited.

Of course, the foregoing description is that of certain features, aspects and advantages of the present invention, to which various changes and modifications can be made without departing from the spirit and scope of the present invention. Moreover, the field replaceable power supply cartridge need not feature all of the objects, advantages, features and aspects discussed above. Thus, for example, those skilled in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. For example, the embodiments of the field replaceable power supply cartridge discussed above can be used with many different types of lighting assemblies or form factors, such as recessed down lights, pendants, sconces, chandeliers, exterior lighting, high-bay warehouse fixtures, landscape lighting, cove lighting, linear lighting, under-cabinet lighting, ceiling mounted fixtures, track lighting, etc. It is contemplated that various combinations or subcombinations of the specific features and aspects between and among the different embodiments may be made and still fall within the scope of the invention. Accordingly, it should be understood that various features and aspects of the disclosed embodiments can be combined with or substituted for one another in order to form varying modes of the discussed field replaceable power supply cartridge.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, 0.1 degree, or otherwise.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A power supply system, comprising:
   a power supply cartridge including a cartridge body having a plurality of sides, a one of the sides of the cartridge body having an electrical connector, a key feature being defined on the one of the sides of the cartridge body, the key feature having a protruding portion including four side walls, a first one of the side walls of the protruding portion of the key feature having a first length being different than a second length of a second one of the side walls of the protruding portion of the key feature;
   a socket including a socket body being coupleable to an electrical wire and having a plurality of sides, a one of the sides of the socket body having another electrical connector adapted for being releasably coupled with the electrical connector of the cartridge body, another key feature being defined on the one of the sides of the socket body, the another key feature having a recessed portion including four side walls, a first one of the side walls of the recessed portion of the another key feature having a first length being different than a second length of a second one of the side walls of the recessed portion of the another key feature;

wherein the key feature has a shape corresponding to another shape of the another key feature such that the cartridge body is adapted for being releasably coupleable with the socket body in a single predetermined orientation with the first one of the side walls of the key feature facing toward the first one of the side walls of the another key feature.

2. The system of claim 1, wherein a third one of the side walls of the protruding portion of the key feature has a third length being different than the first and second lengths of the first and second side walls of the protruding portion of the key feature; and wherein a third one of the side walls of the recessed portion of the another key feature has a third length being different than the first and second lengths of the first and second side walls of the recessed portion of the another key feature.

3. The system of claim 1, wherein the cartridge body has a latch, and wherein the recessed portion of the another key feature of the socket body has a recess being adapted to releasably receive the latch, and wherein the latch and the recess are collectively adapted for releasably securing the cartridge body as being coupled together with the socket body.

4. The system of claim 3, wherein the cartridge body has a gripping member connected with and being adapted for actuating the latch, and wherein the gripping member is adapted to be pushed by a user to actuate the latch.

5. The system of claim 4, wherein the gripping member is included in a flexible portion of the cartridge body.

6. The system of claim 1, wherein the one side of the cartridge body includes a connector socket being formed by another side wall of the key feature, and wherein the electrical connector extends into the connector socket.

7. The system of claim 6, wherein the one side of the socket body includes a further connector socket being formed by a further side wall of the another key feature, wherein the further side wall of the another key feature extends into the recessed portion of the another key feature, and wherein the another electrical connector extends into the further connector socket.

8. The system of claim 7, wherein the further side wall of the further connector socket is adapted for being releasably coupleable with the another side wall of the connector socket.

9. The system of claim 1, wherein the one side of the cartridge body is adapted for being in thermally-conductive contact with the one side of the socket body when the cartridge body is coupled together with the socket body.

10. The system of claim 1, wherein the power supply cartridge includes a driver for a light-emitting diode.

11. The system of claim 1, wherein the socket body has an opening adapted to receive an electrical wire there-through into an inner space of the socket body, and wherein the electrical wire is connectable to the another electrical connector.

12. The system of claim 1, further including a printed circuit board being coupled to the cartridge body, wherein the printed circuit board is connected to the electrical connector.

13. The system of claim 1, wherein the electrical connector includes a multi-pin electrical connector.

14. A power supply cartridge, comprising:
a cartridge body having a plurality of sides, a one of the sides of the cartridge body having an electrical connector, a key feature being defined on the one of the sides of the cartridge body, the key feature having a protruding portion including four side walls, a first one of the side walls of the protruding portion of the key feature having a first length being different than a second length of a second one of the side walls of the protruding portion of the key feature;

wherein the power supply cartridge is adapted for being releasably coupled with a socket body having another electrical connector adapted for being releasably coupled with the electrical connector of the cartridge body, the socket body including another key feature having a recessed portion including four side walls, a first one of the side walls of the recessed portion of the another key feature having a first length being different than a second length of a second one of the side walls of the recessed portion of the another key feature, the key feature having a shape corresponding to another shape of the another key feature such that the cartridge body is adapted for being releasably coupleable with the socket body in a single predetermined orientation with the first one of the side walls of the key feature facing toward the first one of the side walls of the another key feature.

15. The power supply cartridge of claim 14, wherein a third one of the side walls of the protruding portion of the key feature has a third length being different than the first and second lengths of the first and second side walls of the protruding portion of the key feature; and wherein the power supply cartridge is adapted for being releasably coupled with such a socket body in which a third one of the side walls of the recessed portion of the another key feature has a third length being different than the first and second lengths of the first and second side walls of the recessed portion of the another key feature.

16. The power supply cartridge of claim 14, wherein the cartridge body has a latch, and wherein the power supply cartridge is adapted for being releasably coupled with such a socket body in which the recessed portion of the another key feature has a recess being adapted to releasably receive the latch, and wherein the latch is adapted for releasably securing the cartridge body together with such a recess as being coupled together with such a socket body.

17. The power supply cartridge of claim 16, wherein the cartridge body has a gripping member connected with and being adapted for actuating the latch, and wherein the gripping member is adapted to be pushed by a user to actuate the latch.

18. The power supply cartridge of claim 17, wherein the gripping member is included in a flexible portion of the cartridge body.

19. The power supply cartridge of claim 14, wherein the one side of the cartridge body includes a connector socket being formed by another side wall of the key feature, and wherein the electrical connector extends into the connector socket.

20. The power supply cartridge of claim 19, wherein the power supply cartridge is adapted for being releasably coupled with such a socket body wherein a side of the socket body includes a further connector socket being formed by a further side wall of the another key feature, and the further side wall of the another key feature extends into the recessed portion of the another key feature, and the another electrical connector extends into the further connector socket.

21. The power supply cartridge of claim 20, wherein the power supply cartridge is adapted for being releasably coupled with such a socket body in which the further side wall of the further connector socket is adapted for being releasably coupleable with the another side wall of the connector socket.

22. The power supply cartridge of claim 14, wherein the one side of the cartridge body is adapted for being in thermally-conductive contact with a side of such a socket body when the cartridge body is coupled together with such a socket body.

23. The power supply cartridge of claim 14, further including a driver for a light-emitting diode.

24. The power supply cartridge of claim 14, further including a printed circuit board being coupled to the cartridge body, wherein the printed circuit board is connected to the electrical connector.

25. The power supply cartridge of claim 14, wherein the electrical connector includes a multi-pin electrical connector.

* * * * *